(12) United States Patent
Persoon et al.

(10) Patent No.: US 11,127,560 B2
(45) Date of Patent: Sep. 21, 2021

(54) CHARGED PARTICLE MICROSCOPE WITH A MANIPULATOR DEVICE, AND METHOD OF PREPARING A SPECIMEN WITH SAID CHARGED PARTICLE MICROSCOPE

(71) Applicant: FEI Company, Hillsboro, OR (US)

(72) Inventors: Johannes A. H. W. G. Persoon, Eindhoven (NL); Andreas Theodorus Engelen, Eindhoven (NL); Ruud Schampers, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/542,053

(22) Filed: Aug. 15, 2019

(65) Prior Publication Data
US 2020/0066482 A1 Feb. 27, 2020

(30) Foreign Application Priority Data
Aug. 21, 2018 (EP) .................................... 18190045

(51) Int. Cl.
*H01J 37/252* (2006.01)
*H01J 37/244* (2006.01)
*G02B 21/34* (2006.01)
*H01J 37/20* (2006.01)

(52) U.S. Cl.
CPC ............ *H01J 37/252* (2013.01); *G02B 21/34* (2013.01); *H01J 37/20* (2013.01); *H01J 37/244* (2013.01)

(58) Field of Classification Search
USPC ......................................................... 250/310
See application file for complete search history.

(56) References Cited

U.S. PATENT DOCUMENTS

| 5,225,683 | A  | * | 7/1993 | Suzuki ..................... | H01J 37/20 |
|           |    |   |        |                            | 250/442.11 |
| 7,375,325 | B2 | * | 5/2008 | Burkhardt ................. | B25J 7/00 |
|           |    |   |        |                            | 250/306 |
| 9,570,269 | B2 | * | 2/2017 | Lechner ................... | B32B 38/10 |
| 9,741,527 | B2 | * | 8/2017 | Vystavel ................. | H01J 37/16 |
| 10,629,409 | B2 | * | 4/2020 | Vaske ..................... | H01J 37/26 |

FOREIGN PATENT DOCUMENTS

| CN | 205 363 650 | 7/2016 |
| CN | 206 566 029 | 10/2017 |
| JP | 2005 205573 A | 8/2005 |
| WO | 2005/031789 | 4/2005 |

\* cited by examiner

*Primary Examiner* — Phillip A Johnston

(57) ABSTRACT

The invention relates to a charged particle microscope (CPM) that at least includes a sample holder, for holding a sample, and a manipulator device arranged for transferring a lamella created in said sample out of said sample, wherein said manipulator device comprises a first elongated manipulator member with a first outer end, and a second elongated manipulator member with a second outer end. The outer ends are movable for mechanically gripping and releasing said lamella. In embodiments, the elongated manipulator members comprise off-set parts that increase manoeuvrability, accessibility, and monitorability of the manipulator device during use.

21 Claims, 7 Drawing Sheets

B-B

CHARGED PARTICLE MICROSCOPE WITH A MANIPULATOR DEVICE, AND METHOD OF PREPARING A SPECIMEN WITH SAID CHARGED PARTICLE MICROSCOPE

FIELD OF THE INVENTION

The invention relates to a charged particle microscope with a manipulator device, and a method of preparing a specimen in such a charged particle microscope.

BACKGROUND OF THE INVENTION

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example.

A specimen to be viewed in a (S)TEM generally has to be very thin (e.g. with a thickness of the order of a few hundred nm, or less), so as to allow sufficient transmission of electrons therethrough. A thin (flake-like) specimen of this type is conventionally referred to as a lamella, and is generally cut from a larger ("bulk") sample in a dual-beam apparatus such as a FIB-SEM.

The workflow for doing so includes providing a sample onto a sample holder, and using an ion beam to cut a furrow around a selected portion of said sample. Then a manipulator needle is welded to said portion, and said portion is severed from the rest of said sample. Finally, using the needle, a so called lift-out is performed wherein the portion is lifted away from the rest of the sample for forming a lamella. After lift-out, this lamella is transferred to a lamella support, such as a FIB lift out grid, where it is carefully placed in a required orientation for use in a (S)TEM (or other type of CPM). Once the lamella is in place, a de-welding operation is needed to remove the manipulator needle from the lamella.

Unfortunately, this procedure tends to be very delicate and time-consuming, which can cause a substantial (and expensive) bottleneck in industrial situations such as semiconductor device inspection, biological tissue studies (e.g. in drug development and testing), and geological analysis workflows (e.g. in petrology/mineralogy). In particular, it is very difficult to place the lamella in the required orientation on the lamella support. In particular, the thin lamella needs to be (almost) in the same plane as the lamella support, to ensure that the lamella can be positioned correctly in the (S)TEM for further examination. Furthermore, the transfer of the lamella from the sample to said support involves welding and de-welding operations, which can damage the sample portion, and can even lead to its loss. It is for example possible that the lamella falls off the needle, or off the support. Accordingly, transfer needs to be performed carefully and slowly by a skilled operator—which adversely affects throughput and available resources.

SUMMARY

With the above in mind, it is an object of the disclosure to address one or more of these drawbacks. More specifically, it is an object of the disclosure to provide a charged particle microscope with which a lamella may be prepared in an improved way.

To this end, the disclosure provides a charged particle microscope according to claim 1. The charged particle microscope (CPM) comprises a sample holder, for holding a sample, in particular for holding the "bulk" sample from which a lamella is to be taken. The CPM further comprises an ion beam column, for producing an ion beam that propagates along an ion axis onto said sample for creating a lamella in said sample, for example using a method as generally described above. Furthermore, the CPM comprises a detector, for detecting radiation emanating from said lamella and/or said sample in response to irradiation by said ion beam, as well as a controller, for at least partially controlling operation of said microscope.

For transferring said lamella created in said sample out of said sample, the CPM comprises a manipulator device. Said manipulator device comprises a first elongated manipulator member with a first outer end, and a second elongated manipulator member with a second outer end, wherein said manipulator device is arranged such that said first and second outer ends are movable with respect to each other, for mechanically gripping and releasing said lamella. By using two elongated manipulator members that are arranged for gripping said lamella, it is possible to grip the lamella in a fast, reliable and easy way, for lifting the lamella out of the bulk sample, for example, for further preparation and/or analysis. Time consuming welding and de-welding is not required anymore, and since the manipulator members provide a reliable grip, the chance of loss of the lamella (e.g. due to falling of the manipulator device) is decreased. Thus, with the CPM according to the disclosure, the lamella may be prepared in an improved way. With this, the object of the disclosure is achieved.

Further embodiments of the disclosure will be explained below.

The elongated manipulator members are in particular nanomanipulator members, having a size and shape adapted to the typical size and shape of the lamella.

The outer ends of the two manipulator members are arranged in such a way as to define two opposing gripping surfaces that may be brought into contact with each other, such that a reliable and appropriate clamping force can be exerted (and maintained) onto the lamella. The manipulator members are substantially movable in a direction perpendicular to said gripping surfaces, for increasing and/or decreasing the distance between said two opposing gripping surfaces. This means that at least one of the manipulator members is movable. For example, one manipulator member may be stationary, and the other may be movable. Alternatively, both manipulator members may be movable with respect to a frame of the charged particle microscope.

For ease of reference with respect to some embodiments, three substantially orthogonal planes will next be defined, and elucidated further below:

a sagittal plane dividing the manipulator members into left and right parts;

a coronal plane dividing the manipulator members into front and back parts;

and a transversal plane dividing the manipulator members into top and bottom parts.

The first plane, i.e. the sagittal plane, can be defined by means of the two gripping surfaces provided on the outer ends of the two manipulator members. The manipulator members are movable from an open position to a closed position. In the open position the two opposing gripping surfaces of the outer ends of the manipulator members are positioned at a distance from one another. In the closed position the gripping surfaces are in contact with one another, or at least nearly in contact with one another. In this closed position the sagittal plane, also referred to as gripping plane, is defined by the gripping surfaces that contact each other. The outer ends of the manipulator members lie on opposite sides of the sagittal plane.

The second plane, i.e. the coronal plane, divides the manipulator members into front and back parts. The elongated manipulator members generally extend in a longitudinal direction that is parallel to said sagittal plane. The coronal plane is defined by the two longitudinal axes of the outer ends of the two elongated manipulator members. The coronal plane is substantially perpendicular to the sagittal plane.

The third plane, i.e. the transverse plane, is a plane that is orthogonal to the sagittal plane and the coronal plane. The transverse plane is defined to run through the gripping surfaces of the manipulator members, in a closed position thereof.

Thus, the sagittal plane, the coronal plane and the transverse plane are substantially orthogonal with respect to each other.

The above definition of the three planes will be used below, in some embodiments, to define advantageous features of the manipulator members. It is noted that in particular reference is made to the first elongated manipulator member. It is noted that the shape of the second elongated manipulator member may, in some embodiments, substantially conform to the shape of the first elongated manipulator member, even if this is not explicitly mentioned.

As stated before, the outer ends of the manipulator members are movable in a direction perpendicular to said sagittal plane in order to be able to mechanically grip and release said lamella. In an embodiment, at least one of the manipulator members is pivotable about a pivot axis. For example, said at least one manipulator member may be pivotably connected to the charged particle microscope. Said pivot axis generally is perpendicular to the aforementioned coronal plane.

In an embodiment, said first elongated manipulator member comprises a distal part having said first outer end, and said first elongated manipulator member comprises a proximal part connected to said distal part. Said proximal part extends substantially parallel to said distal part. Said distal part lies substantially in said coronal plane. The second elongated manipulator member may comprise a distal part having said second outer end, and said second elongated manipulator member comprises a proximal part connected to said distal part. Both distal parts generally lie in the coronal plane, and on opposite sides of the sagittal plane.

In an embodiment, said proximal part of the first elongated manipulator member lies outside said sagittal plane (but in particular substantially parallel to said sagittal plane). This means that said proximal part is positioned with an off-set with respect to the longitudinal axis of said distal part. This embodiment provides more room for accurately manoeuvring the manipulator device to desired locations, such as, for example, a lamella support. Said proximal part of the second elongated manipulator member may lie outside the sagittal plane as well, to provide more room as well.

An intermediate part that connects said proximal part to said distal part may be provided, in an embodiment. Said intermediate part extends substantially non-parallel to said distal part and/or non-parallel to said proximal part. This allows the desired shape to be given to the elongated manipulator member.

Said intermediate part may be shaped such that said proximal part is positioned with an off-set with respect to the longitudinal axis of said distal part. In particular, said intermediate part is shaped such that said proximal part is positioned with an off-set in a direction normal to the gripping plane. This allows for improved manoeuvrability with respect to a lamella support, i.e. improved accessibility of said lamella to said lamella support.

Alternatively, said intermediate part is shaped such that said proximal part is positioned with an off-set in a direction parallel to said gripping plane. This allows room for visibility from above, such that an operator may monitor the manipulator device during operation of the CPM.

In an embodiment, said intermediate part is shaped such that said proximal part is positioned with an off-set in a direction normal to said gripping plane as well as with an off-set in a direction parallel to said gripping plane. This provides the benefits of increased manoeuvrability, i.e. improved accessibility, with respect to a lamella support, as well as improved monitorability of the manipulator device (with lamella) during operation of the CPM.

Said intermediate part may extend at a first non-zero angle with respect to said proximal part and/or at a second non-zero angle with respect to said distal part.

In particular, said intermediate part may extend at an angle with respect to said coronal plane, i.e. extending with a component in a direction parallel to the normal of the coronal plane. This way, the outer end at the distal part of the manipulator device is better visible from above, i.e. in a direction normal to the transverse plane. This allows the operator to better view the manipulation of the manipulator device during use.

In particular, said intermediate part may additionally, or alternatively, extend at an angle with respect to said sagittal plane. This way, too, the outer end of the manipulator device is visible from above. This allows the operator to better view the manipulation of the manipulator device during use. Additionally, an angle with respect to the sagittal gripping plane also allows the lamella to be more easily placed inside a lamella support, as this design allows the manipulator device to approach the lamella support sideways into said lamella support (which extends, in use, substantially parallel to said gripping plane).

In an embodiment, said intermediate part extends at an angle with respect to all the three planes, i.e. the sagittal plane, the coronal plane, and the transverse plane. In particular, both intermediate part may extend at an angle with respect to these planes. The intermediate part thus extends sideways, and backwards at the same time, enabling the operator to better view the manipulation of the manipulator device, in particular of the outer ends comprising the gripping surfaces, as well as providing better manoeuvrability for placing the lamella into said lamella support.

In an embodiment, the charged particle microscope comprises a lamella support, in particular a FIB lift out grid, such as a halfmoon grid. A mechanical support contour may be provided as well, wherein said lamella support is placed inside said mechanical support contour. Said support contour may be ring-shaped, annular, or have a substantially closed contour. One of the advantages of the charged particle microscope according to the disclosure is that it allows lamella to be placed on a lamella support whilst this lamella support is placed inside said mechanical support. Instead of an indirect transfer of placing the lamella on the lamella support, and then connecting the lamella support with lamella to the mechanical support, a direct transfer is possible. This saves time, and reduces the risk of damaging the lamella, e.g. during placement of the lamella support in the mechanical support.

In an embodiment, the charged particle microscope further comprises:

a lamella holder for holding said lamella support; as well as an electron beam column, for producing an electron beam that propagates along an electron axis onto said lamella holder.

This allows the lamella created by the ion beam to be directly examined by means of an electron beam. The detector of the CPM may additionally be arranged for detecting radiation emanating from said lamella in said lamella holder in response to irradiation by said electron beam. Alternatively, a further detector may be provided for detecting radiation emanating from said lamella in said lamella holder in response to irradiation by said electron beam.

It is noted that in an embodiment, during use of the manipulation device for manipulating the lamella, signals obtained by the detector and/or the further detector, if present, are used to monitor the manipulation of the lamella. These signals may be transformed into images, such as video. The operator may use the video to monitor the manipulation. This is known per se to those skilled in the art.

According to an aspect, the disclosure provides a method of operating a charged particle microscope as described above. The method according to the disclosure comprises the steps of:

Providing a sample in said sample holder;

Creating, using said ion beam column, a lamella in said sample;

Transferring said lamella out of said sample.

Transferring said lamella out of said sample is in particular performed by means of the manipulator device, comprising a first elongated manipulator member with a first outer end, and a second elongated manipulator member with a second outer end, wherein said manipulator device is arranged such that said first and second outer ends are movable with respect to each other, for mechanically gripping and releasing said lamella. As stated above, by using two elongated manipulator members that are arranged for gripping said lamella, it is possible to grip the lamella in a fast, reliable and easy way, for lifting the lamella out of the bulk sample, for example, for further preparation and/or analysis. Using this method, time consuming welding and de-welding is not required anymore, and since the manipulator members provide a reliable grip, the chance of loss of the lamella (e.g. due to falling of the manipulator device) is decreased.

The elongated manipulator members are in particular nanomanipulator members, having a size and shape adapted to the typical size and shape of the lamella. In other words, the nanomanipulator members are adapted to be used for gripping and releasing the lamella.

In an embodiment of the method, the method comprises the step of transferring said lamella to said lamella support. In particular, the method comprises the step of transferring said lamella to said lamella support in said mechanical support contour, which may be ring-shaped or annular. In other words, in this embodiment, the lamella is placed on the assembly of the lamella support and the mechanical support. Thus, instead of a two-step transfer (lamella is placed on lamella support, and subsequently said lamella support is placed in said mechanical support), a one-step transfer of the lamella onto the assembly of the lamella support and the mechanical support suffices. This saves time, and—more importantly—reduces the risk of damaging the lamella, e.g. during placement of the lamella support in the mechanical support.

It is in particular advantageous in case the manipulator members are shaped in such a way that a sideways approach to the lamella support is made possible. It is additionally, or alternatively, advantageous in case the manipulator members are sized and shaped in such a way that the operator is able to view the outer ends of the manipulator members, for example from above. Possible shapes have been described above. In particular, improved approachability and visibility is obtained in case the two manipulator members each have a proximal part, an intermediate part, and a distal part, wherein the proximal part is parallel to the respective distal part, and both intermediate parts are angled with respect to both the coronal plane and the sagittal plane, and wherein both intermediate parts of said first elongated manipulator member and said second elongated manipulator member extend mainly parallel to each other.

BRIEF DESCRIPTION OF THE DRAWINGS

The invention will now be elucidated in more detail on the basis of exemplary embodiments and the accompanying schematic drawings, in which.

In the Figures, where pertinent, corresponding parts are indicated using corresponding reference symbols.

DETAILED DESCRIPTION OF EMBODIMENTS

Figure 1:
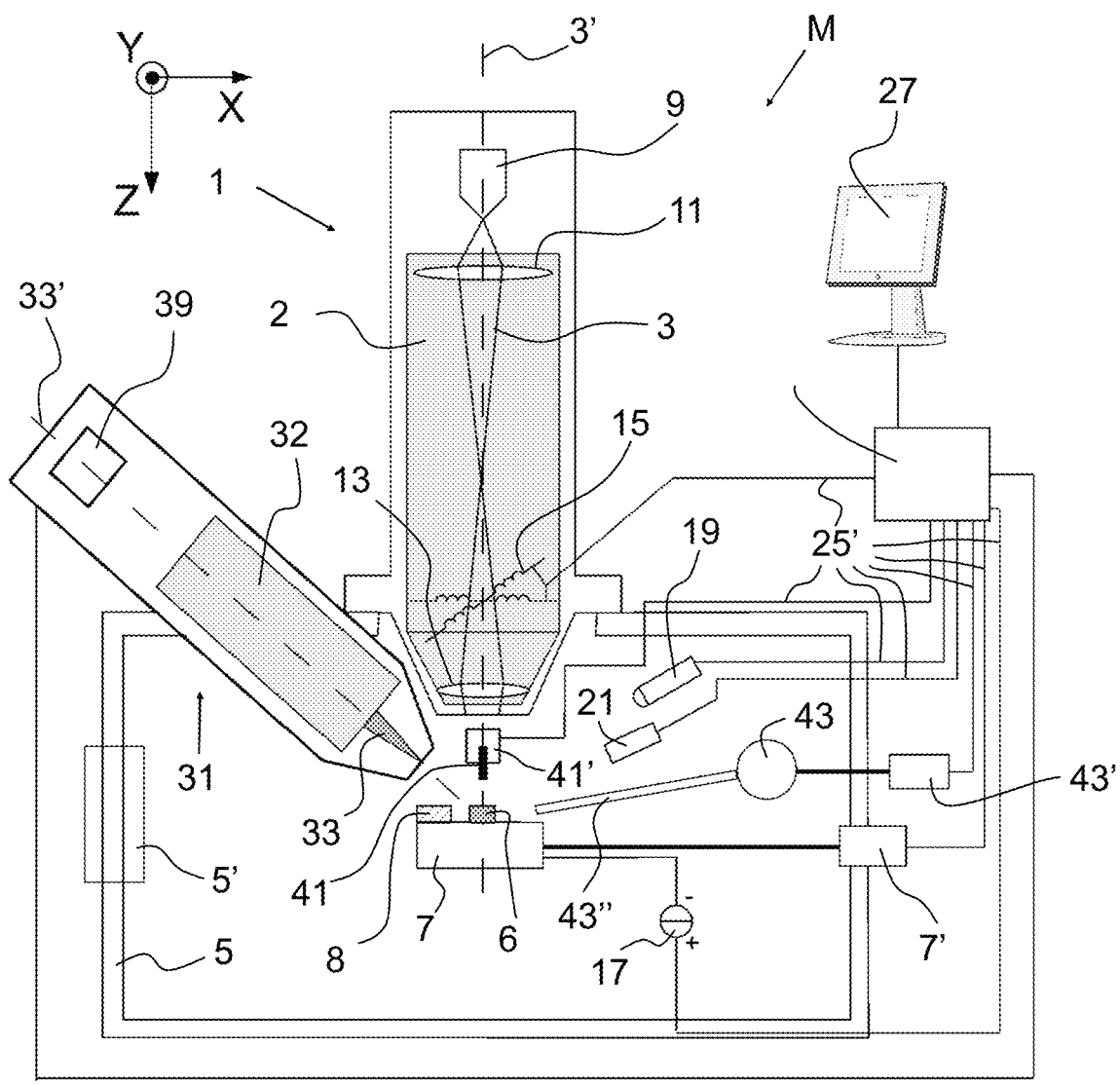
FIG. 1—renders a longitudinal cross-sectional elevation view of an embodiment of a dual-beam CPM according to an embodiment of the disclosure.

FIG. 1 shows a highly schematic depiction of an embodiment of a dual-beam charged particle microscope (CPM) in which the present disclosure is implemented; more specifically, it shows an embodiment of a FIB-SEM. The microscope M comprises a particle-optical column 1, which produces a beam 3 of charged particles (in this case, an electron beam) that propagates along a particle-optical axis 3'. The column 1 is mounted on a vacuum chamber 5, which comprises a sample holder 7 and associated actuator(s) 7' for holding/positioning a sample 6. The vacuum chamber 5 is evacuated using vacuum pumps (not depicted). With the aid of voltage supply 17 the sample holder 7, or at least the sample 6, may, if desired, be biased (floated) to an electrical potential with respect to ground. Also depicted is a vacuum port 5', which may be opened so as to introduce/remove items (components, samples) to/from the interior of vacuum chamber 5. A microscope M may comprise a plurality of such ports 5', if desired.

The column 1 (in the present case) comprises an electron source 9 (such as a Schottky gun, for example) and an illuminator 2. This illuminator 2 comprises (inter alia) lenses 11, 13 to focus the electron beam 3 onto the sample 6, and a deflection unit 15 (to perform beam steering/scanning of the beam 3). The microscope M further comprises a controller/computer processing apparatus 25 for controlling inter alia the deflection unit 15, lenses 11, 13 and detectors 19, 21, and displaying information gathered from the detectors 19, 21 on a display unit 27.

The detectors 19, 21 are chosen from a variety of possible detector types that can be used to examine different types of "stimulated" radiation emanating from the sample 6 in response to irradiation by the (impinging) beam 3. In the apparatus depicted here, the following (non-limiting) detector choices have been made:

Detector 19 is a solid state detector (such as a photodiode) that is used to detect cathodoluminescence emanating from the sample 6. It could alternatively be an X-ray detector, such as Silicon Drift Detector (SDD) or Silicon Lithium (Si(Li)) detector, for example;

Detector 21 is an electron detector in the form of a Solid State Photomultiplier (SSPM) or evacuated Photomultiplier Tube (PMT) [e.g. Everhart-Thornley detector], for example. This can be used to detect backscattered and/or secondary electrons emanating from the sample 6.

The skilled artisan will understand that many different types of detector can be chosen in a set-up such as that depicted, including, for example, an annular/segmented detector.

By scanning the beam 3 over the sample 6, stimulated radiation—comprising, for example, X-rays, infrared/visible/ultraviolet light, secondary electrons (SEs) and/or backscattered electrons (BSEs)—emanates from the sample 6. Since such stimulated radiation is position-sensitive (due to said scanning motion), the information obtained from the detectors 19, 21 will also be position-dependent. This fact allows (for instance) the signal from detector 21 to be used to produce a BSE image of (part of) the sample 6, which image is basically a map of said signal as a function of scan-path position on the sample 6.

The signals from the detectors 19, 21 pass along control lines (buses) 25'; are processed by the controller 25; and displayed on display unit 27. Such processing may include operations such as combining, integrating, subtracting, false colouring, edge enhancing, and other processing known to the skilled artisan. In addition, automated recognition processes (e.g. as used for particle analysis) may be included in such processing.

In addition to the electron column 1 described above, the microscope M also comprises an ion-optical column 31. This comprises an ion source 39 and an illuminator 32, and these produce/direct an ion beam 33 along an ion-optical axis 33'. To facilitate easy access to sample 6 on holder 7, the ion axis 33' is canted relative to the electron axis 3'. As hereabove described, such an ion (FIB) column 31 can, for example, be used to perform processing/machining operations on the sample 6, such as incising, milling, etching, depositing, etc. Alternatively, the ion column 31 can be used to produce imagery of the sample 6. It should be noted that ion column 31 may be capable of generating various different species of ion at will, e.g. if ion source 39 is embodied as a so-called NAIS source; accordingly, references to ion beam 33 should not necessarily been seen as specifying a particular species in that beam at any given time—in other words, the beam 33 might comprise ion species A for operation A (such as milling) and ion species B for operation B (such as implanting), where species A and B can be selected from a variety of possible options.

Also illustrated is a Gas Injection System (GIS) 43, which can be used to effect localized injection of gases, such as etching or precursor gases, etc., for the purposes of performing gas-assisted etching or deposition. Such gases can be stored/buffered in a reservoir 43', and can be administered through a narrow nozzle 43", so as to emerge in the vicinity of the intersection of axes 3' and 33', for example.

It should be noted that many refinements and alternatives of such a set-up will be known to the skilled artisan, such as the use of a controlled environment within (a relatively large volume of) the microscope M, e.g. maintaining a background pressure of several mbar (as used in an Environmental SEM or low-pressure SEM).

Of particular interest in the context of the present disclosure is manipulator device (nanomanipulator) 41, which can be used to assist in transferring items (e.g. samples, or parts thereof) to/from the sample holder 7.

Figure 2:
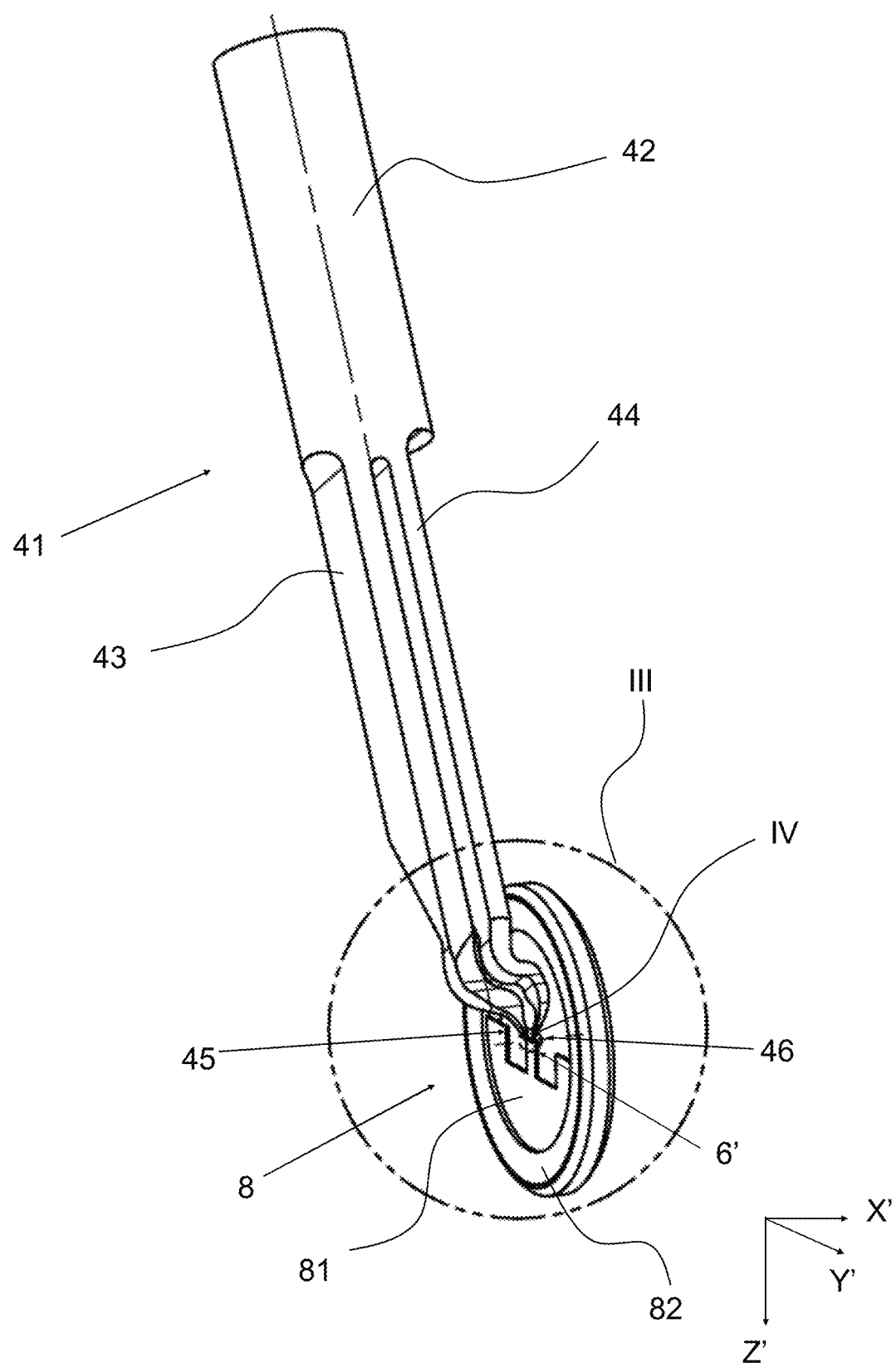
FIG. 2-7—show different views of a manipulator device according to an embodiment of the disclosure.

First turning to FIG. 2, a manipulator device 41 according to an embodiment of the disclosure is shown, for transferring a lamella 6' onto a further sample holder 8 that comprises a lamella support 81 and a mechanical support 82. The lamella support 81 is in particular a FIB lift out grid, such as a halfmoon grid depicted here. It is noted that other grid shapes are possible, and that the disclosure is not limited to the use of a halfmoon grid, or any particular grid in general. Other shapes may include ring-shaped, annular, or substantially closed contour shaped grids as well. The manipulator device 41 comprises a base 42 from which two manipulator members 43, 44, a first and a second, in the form of elongated beams 43, 44 project in a downward direction. The base 42 may be connected to a frame part of the CPM (not shown). The first elongated manipulator member 43 has a first outer end 45, and the second elongated manipulator member 44 has a second outer end 46. The length and material of the elongated manipulator members are such that said first and second outer ends 45, 46 are movable with respect to each other, in particular in a X' direction, for mechanically gripping and releasing a lamella 6' obtained from a sample 6. Movement of the two elongated manipulator members 43, 44 may be established by means of an actuator element, which, for example, is in the form of a Piezo element. The size and shape of the first and second elongated manipulator members is, in this embodiment, such that the lamella 6' can be easily placed in the lamella support 81 without the manipulator device 41 touching the mechanical support ring 82. The manipulator device may first approach the lamella support 81 sideways (i.e. X' direction), and secondly move downwards (i.e. Z' direction) for placement of the lamella 6'.

Figure 3:
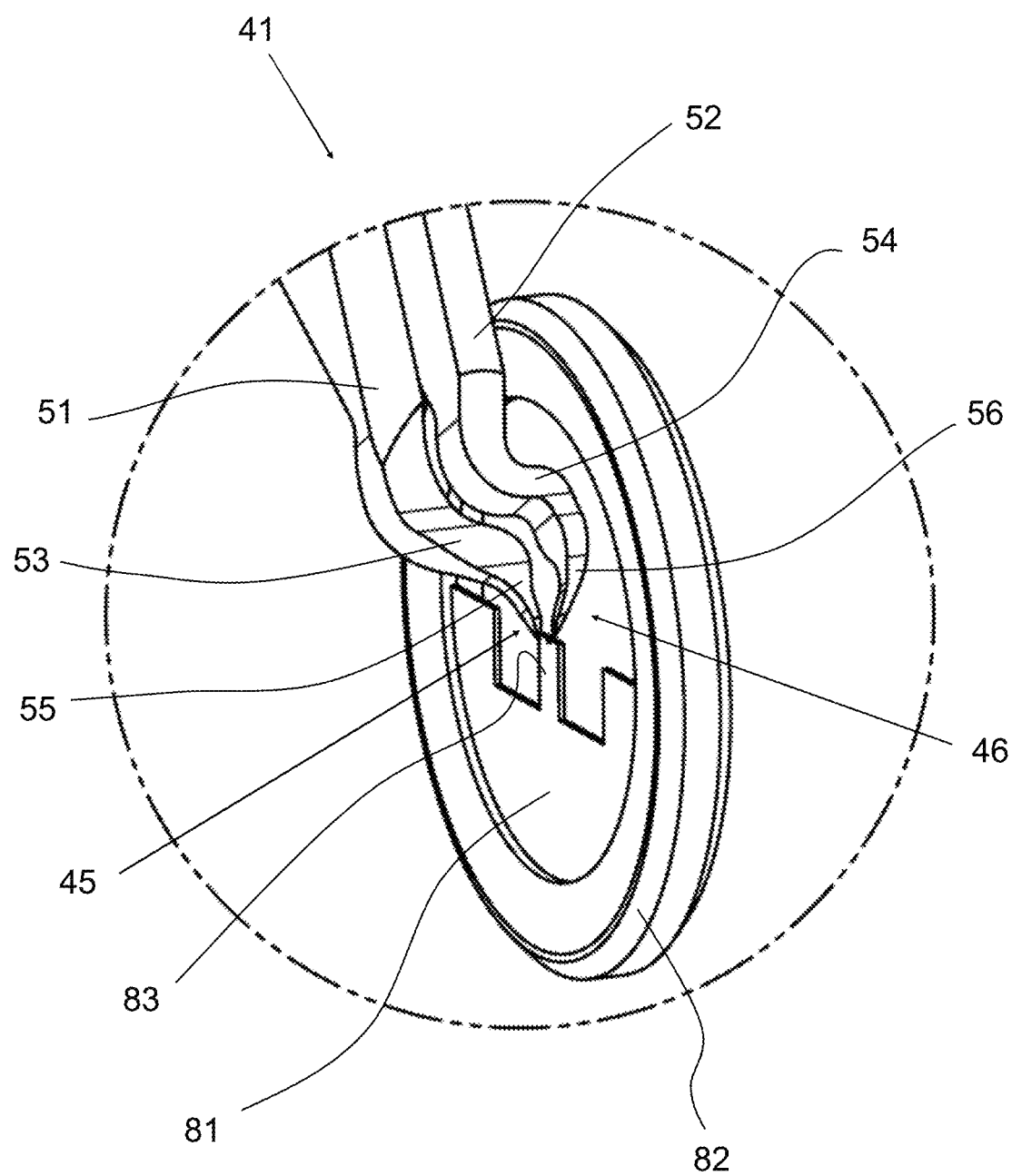

FIG. 3 shows a close up of the region III of FIG. 2. Here it can be seen that the first elongated manipulator member 43 comprises a distal part 55 having said first outer end, as well as comprising a proximal part 51 connected to said distal part 55. Likewise, the second elongated manipulator member 44 comprises a distal part 56 having said second outer end, as well as comprising a proximal part 52 connected to said distal part 56 of said second manipulator member 44. Additionally, an intermediate part 53 is provided that connects said proximal part 51 to said distal part 55 of said first elongated manipulator member 43. Likewise, the second elongated manipulator member 44 comprises an intermediate part 54 that connects said proximal part 52 to said distal part 56 of said second elongated manipulator member 44. As can be seen in FIG. 3, the respective intermediate parts 53, 54 extend substantially non-parallel to the respective distal part 55, 56 and the respective proximal part 51, 52.

It can be seen that the intermediate parts 53, 54 extend at a first non-zero angle with respect to said respective proximal parts 51, 52. Said intermediate parts 53, 54 also extend at a second non-zero angle with respect to said distal part 55, 56. Due to this, the respective distal parts 55, 56 of the two manipulator members 43, 44 are positioned with an off-set with respect to the (local) longitudinal axis of the respective proximal parts 51, 52. Here it is noted that the shape of said second elongated manipulator member 44 substantially conforms to the shape of said first elongated manipulator member 43. The general shape is the shown shape, even though some differences exist to make the two manipulator members 43, 44 complementary to each other.

Figure 4:
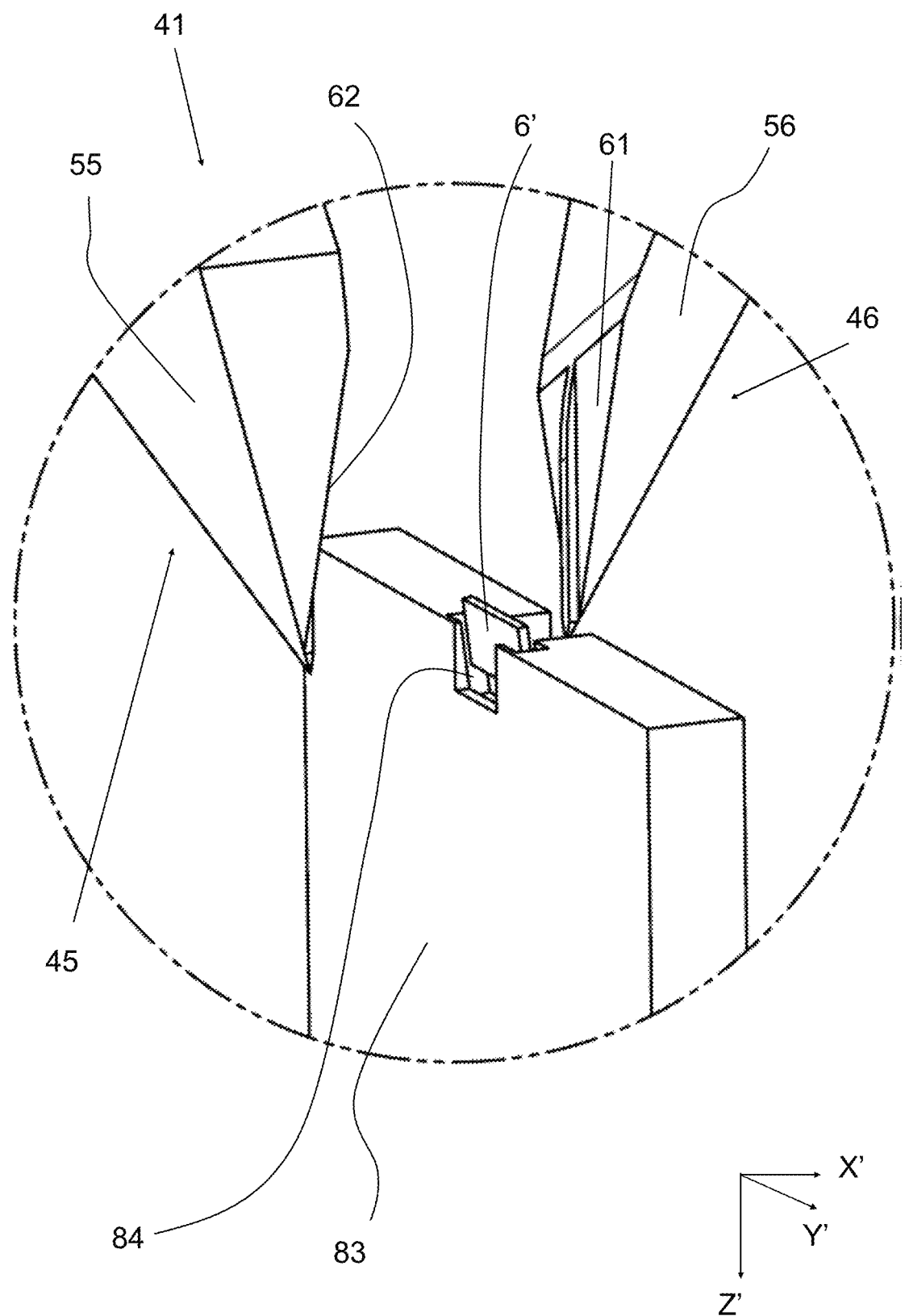
Figure 7:
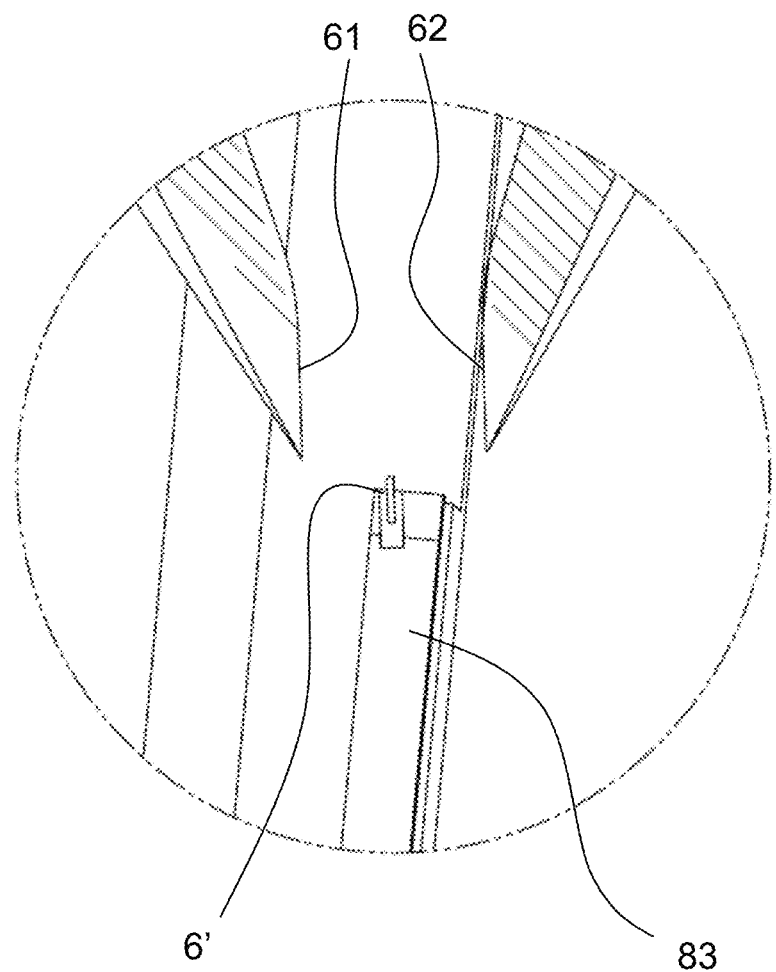
Figure 7:
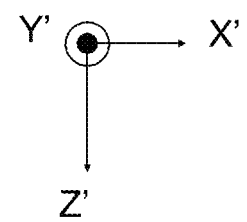

FIG. 4 shows a further enlargement of the outer ends 45, 46 of the manipulator device 41. The lamella support 81 comprises a support projection 83 having a lamella recess 84 for receiving a lamella 6' therein. The lamella 6' can be positioned in this recess, in a swift and reliable manner, by means of the manipulator device. To this end, gripping surfaces 61, 62 provided on the outer ends 55, 56 of the two manipulator members are brought into contact with the lamella 6', and the lamella 6' is moved sideways to above the recess 84, and then downward into the recess 84. The outer ends 45, 46 of the manipulator members are moved away from each other (in X' direction) to move the gripping surfaces 61, 62 away from the lamella 6', such that the lamella 6' remains in the recess 84. It is noted that FIG. 7 shows a front view (negative Y' direction) of the outer ends of the manipulator device, showing the gripping surfaces 61, 62, and the lamella 6' placed in the recess of the support projection 83.

In the embodiment shown in FIG. 4, a lamella recess is used for attaching a lamella to a lamella support. In another embodiment (not shown) the manipulator device according to the disclosure may be used for lifting the lamella out of the bulk, and holding it close to a lamella support. Then, the lamella may be welded to said lamella support. Once welded, the manipulator device may be released from the lamella. It will be understood that the disclosure is not limited to a specific way of attaching the lamella to the lamella support. Other ways of attaching a lamella to a support are encompassed as well.

Figure 5:
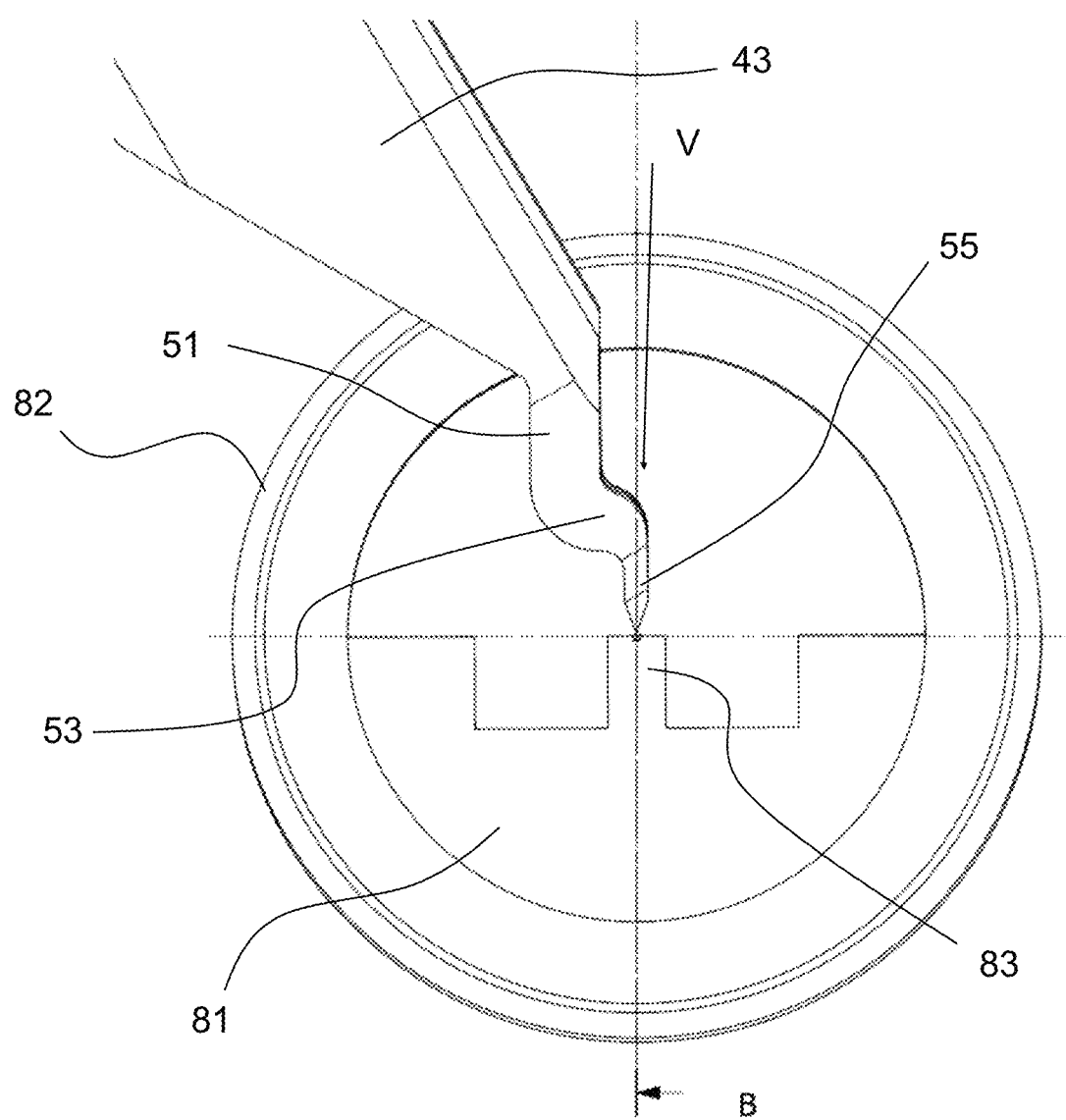
Figure 6:
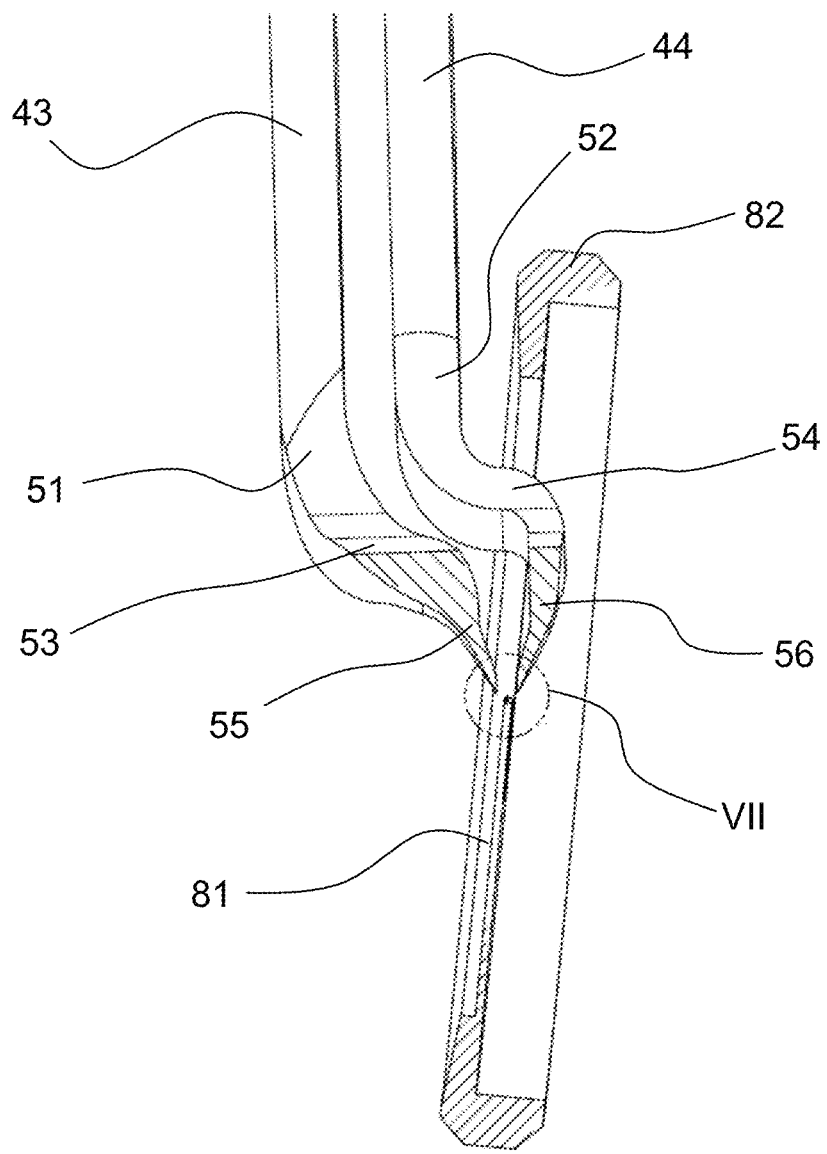
Figure 6:
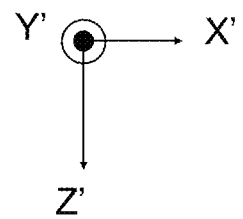

FIGS. 5 and 6 show side and front views, respectively, of the manipulator device as shown in FIGS. 2 to 4. For further description of the embodiments of the manipulator device 41, it is convenient to refer to the previously defined three substantially orthogonal planes:

the sagittal plane dividing the manipulator members 43, 44 into left and right parts (i.e. the Y'Z'-plane);

the coronal plane dividing the manipulator members 43, 44 into front and back parts (i.e. the X'Z'-plane); and the transversal plane dividing the manipulator members 43, 44 into top and bottom parts (i.e. the X'Y'-plane).

It is noted that the same X'Y'Z' coordinate system is shown in FIGS. 2-7, for ease of reference to the above mentioned planes.

Now returning to FIG. 5, it is shown how the intermediate part 53 is angled with respect to the distal part 55 and the proximal part 51, such that a view line V is established with which an operator is able to view the outer ends of the manipulator device from above, i.e. in a Z' direction. As can be seen, the intermediate part 53 has an angle with respect to the X'Z'-plane (i.e. the coronal plane), whilst the distal part 55 and the proximal part 51 are mainly parallel to this X'Z'-plane. The intermediate part 53 is substantially parallel, or even slightly angled, to the X'Y'-plane (i.e. the transversal plane). It should be noted that a larger angle with respect to this transversal plane is conceivable as well.

FIG. 6 shows how the intermediate part 53, 54 have an angle with respect to the Y'Z'-plane (i.e. the sagittal plane), whilst the distal parts 55, 56 and the proximal parts 51, 52 are substantially parallel to the Y'Z' plane. Additionally, the intermediate part 53 of the first elongated manipulator member 43 has an angle with respect to the X'Y'-plane (i.e. the transversal plane), whilst the intermediate part 54 of the second elongated manipulator member 44 is substantially parallel to this X'Y' plane. It should be noted, however, that the latter intermediate part 54 may have an angle with respect to this X'Y'-plane as well.

Due to the angles of the intermediate parts, a double offset is obtained, meaning that the proximal parts 51, 52 are offset in (negative) X'-direction and in (negative) Y'-direction, i.e. an off-set in a direction normal to the gripping plane (sagittal plane) and in a direction parallel to said gripping plane. This provides benefits in terms of manoeuvrability, i.e. accessibility, and monitoring during manipulation.

With the manipulator device and the CPM according to the disclosure, it is relatively easy to lift-out a lamella 6' (that will ultimately become a TEM lamella) excised from the bulk sample 6 using ion beam 33. Such a lift-out procedures may comprise (see FIG. 1):

A bulk sample 6 is provided and held on (a generic sample area of) sample holder 7. Using an ion beam 33 from ion beam column 31, a furrow (trench/moat) is cut (milled, excavated, etched, ablated) around a selected portion of the sample 6. This portion, also called lamella, is still attached to the rest of sample 6 via a thin bridge of sample material.

The manipulator device 41 and/or sample holder 7 is moved (using, for example, actuator system 7') so as to position the sample portion near the manipulator device. The manipulator members may be moved with respect to each other for gripping the sample portion. Once gripping contact has been established, the abovementioned bridge is severed (e.g. using a beam 33 from ion column 31) and the sample holder 7 is retracted from the manipulator device 41, as a result of which the portion or lamella is lifted-out (liberated) from the rest of the sample 6. Thus, in a sense, a lamella is created and transferred out of said sample by means of the manipulator device 41.

If desired, the sample portion may be further machined (e.g. using a beam from ion column 31), so as to thin/mill it appropriately.

The sample holder 7 may now be re-positioned under the manipulator device 41 so as to position the lifted-out portion just the above lamella support 8. Then the lifted-out portion, or lamella 6', may be transferred to the lamella support 8, using the aforementioned monitoring and manoeuvrability, by placing it in the recess 84 of the lamella support. In this step, said lamella support may be provided pre-assembled in a mechanical support, such as a mechanical support ring. During placement, signals obtained by the detector and/or the further detector, that are converted for example into video images, may be used for monitoring the manipulation of the manipulator device and the lamella.

The lamella 6' in said pre-assembled mechanical support and lamella support, may be examined using an electron beam column, for producing an electron beam that propagates along an electron axis onto said lamella, and suitable detectors for detecting radiation emanating from said lamella in said lamella holder in response to irradiation by said electron beam.

The invention has above been explained with reference to some embodiments. The desired protection is to be determined by the appended claims.

The invention claimed is:
1. A charged particle microscope comprising:
a sample holder, for holding a sample;
an ion beam column, for producing an ion beam that propagates along an ion axis onto said sample for creating a lamella in said sample;

a detector, for detecting radiation emanating from said lamella and/or said sample in response to irradiation by said ion beam;
a manipulator device that is arranged for transferring said lamella created in said sample out of said sample; and
a controller, for at least partially controlling operation of said microscope, wherein
said manipulator device comprises a first elongated manipulator member with a first outer end, and a second elongated manipulator member with a second outer end, wherein said manipulator device is arranged such that said first and second outer ends are movable with respect to each other for mechanically gripping and releasing said lamella, and
wherein the manipulator device further comprises an actuator element coupled to move the first or second elongated manipulator member.

2. The charged particle microscope according to claim 1, wherein said first elongated manipulator member comprises a distal part having said first outer end, as well as comprising a proximal part connected to said distal part, wherein said proximal part extends substantially parallel to said distal part, and further comprising an intermediate part that connects said proximal part to said distal part, wherein said intermediate part extends substantially non-parallel to said distal part and/or non-parallel to said proximal part.

3. The charged particle microscope according to claim 2, wherein said intermediate part is shaped such that said proximal part is positioned with an off-set with respect to the longitudinal axis of said distal part.

4. The charged particle microscope according to claim 3, wherein said outer ends have gripping surfaces that define a gripping plane, and wherein said intermediate part is shaped such that said proximal part is positioned with an off-set in a direction normal to said gripping plane.

5. The charged particle microscope according to claim 3, wherein said outer ends have gripping surfaces that define a gripping plane, and wherein said intermediate part is shaped such that said proximal part is positioned with an off-set in a direction parallel to said gripping plane.

6. The charged particle microscope according to claim 3, wherein said outer ends have gripping surfaces that define a gripping plane, and wherein said intermediate part is shaped such that said proximal part is positioned with an off-set in a direction normal to said gripping plane as well as with an off-set in a direction parallel to said gripping plane.

7. The charged particle microscope according to claim 3, wherein the shape of said second elongated manipulator member substantially conforms to the shape of said first elongated manipulator member.

8. The charged particle microscope according to claim 1, further comprising a lamella support grid.

9. The charged particle microscope according to claim 8, further comprising a mechanical support contour, wherein said lamella support grid is placed inside said mechanical support contour.

10. The charged particle microscope according to claim 8, further comprising:
a lamella holder for holding said lamella support; and
an electron beam column, for producing an electron beam that propagates along an electron axis onto said lamella holder.

11. A method of operating a charged particle microscope comprising the steps of:

providing a sample in a sample holder;
creating, using an ion beam column, a lamella in said sample; and
transferring, using a manipulator device, said lamella out of said sample, wherein said manipulator device comprises a first elongated manipulator member with a first outer end, a second elongated manipulator member with a second outer end, and an actuator element coupled to move the first or second elongated manipulator member, wherein said manipulator device is arranged such that said first and second outer ends are movable with respect to each other, for mechanically gripping and releasing said lamella.

12. The method according to claim 11, further comprising transferring said lamella to said lamella support.

13. The method according to claim 12, further comprising transferring said lamella to said lamella support in said mechanical support contour.

14. The method according to claim 11, 12, or 13, wherein during use of the manipulation device, signals obtained by a detector are used to monitor manipulation of the lamella.

15. The method according to claim 14, wherein said signals are transformed into images, such as video.

16. A manipulator device for transferring a lamella created in a sample out of the sample, the manipulator device comprising:
a first elongated manipulator member with a first outer end;
a second elongated manipulator member with a second outer end, wherein said manipulator device is arranged such that said first and second outer ends are movable with respect to each other, for mechanically gripping and releasing the lamella; and
an actuator element coupled to move the first or second elongated manipulator member.

17. The manipulator device of claim 16, wherein said first elongated manipulator member comprises a distal part having said first outer end, as well as comprising a proximal part connected to said distal part, wherein said proximal part extends substantially parallel to said distal part, and further comprising an intermediate part that connects said proximal part to said distal part, wherein said intermediate part extends substantially non-parallel to said distal part and/or non-parallel to said proximal part.

18. The manipulator device of claim 17, wherein said intermediate part is shaped such that said proximal part is positioned with an off-set with respect to the longitudinal axis of said distal part.

19. The manipulator device of claim 18, wherein said outer ends have gripping surfaces that define a gripping plane, and wherein said intermediate part is shaped such that said proximal part is positioned with an off-set in a direction normal to said gripping plane.

20. The manipulator device of claim 18, wherein said outer ends have gripping surfaces that define a gripping plane, and wherein said intermediate part is shaped such that said proximal part is positioned with an off-set in a direction normal to said gripping plane as well as with an off-set in a direction parallel to said gripping plane.

21. The manipulator device of claim 18, wherein the shape of said second elongated manipulator member substantially conforms to the shape of said first elongated manipulator member.

* * * * *